United States Patent
Cheng et al.

(10) Patent No.: US 10,101,783 B2
(45) Date of Patent: Oct. 16, 2018

(54) HEAD MOUNTED DISPLAY

(71) Applicant: Acer Incorporated, New Taipei (TW)

(72) Inventors: Cheng-Yu Cheng, New Taipei (TW); Wen-Neng Liao, New Taipei (TW); Cheng-Wen Hsieh, New Taipei (TW); Yu-Ming Lin, New Taipei (TW)

(73) Assignee: Acer Incorporated, New Taipei (TW)

(*) Notice: Subject to any disclaimer, the term of this patent is extended or adjusted under 35 U.S.C. 154(b) by 0 days.

(21) Appl. No.: 15/679,175

(22) Filed: Aug. 17, 2017

(65) Prior Publication Data

US 2018/0196485 A1 Jul. 12, 2018

(30) Foreign Application Priority Data

Jan. 12, 2017 (TW) .............................. 106100960 A

(51) Int. Cl.
*G02B 27/01* (2006.01)
*G06F 1/20* (2006.01)
*H05K 7/20* (2006.01)

(52) U.S. Cl.
CPC ............ *G06F 1/206* (2013.01); *G02B 27/017* (2013.01); *H05K 7/20963* (2013.01); *G02B 2027/014* (2013.01)

(58) Field of Classification Search
CPC .. G02B 27/0093; G02B 27/01; G02B 27/017; G02B 2027/0132; G06F 3/01; G06F 3/011; G06F 3/012; G06T 19/006
See application file for complete search history.

(56) References Cited

U.S. PATENT DOCUMENTS

| 2013/0222235 A1* | 8/2013 | Abdollahi | .......... G02B 27/0172 345/156 |
| 2015/0253574 A1 | 9/2015 | Thurber | |
| 2016/0212879 A1* | 7/2016 | Nikkhoo | ............ H05K 7/20127 |

FOREIGN PATENT DOCUMENTS

WO 2016187477 11/2016

* cited by examiner

*Primary Examiner* — Sanghyuk Park
(74) *Attorney, Agent, or Firm* — JCIPRNET

(57) ABSTRACT

A head mounted display includes a lens unit, at least one lens temperature sensor, an environment temperature sensor, an environment humidity sensor, a temperature controller, a housing, and a display unit. The lens unit includes a carrier having a touching surface and a back surface opposite to each other and two lenses disposed on the carrier. An enclosed space is formed between a user and the touching surface. The at least one lens temperature sensor is adjacent to the lenses, and the sensors are all disposed on the touching surface. The temperature controller is disposed on the back surface and increases or decreases a temperature of the enclosed space and lens temperatures of the lenses according to sensing actions of the at least one lens temperature sensor, the environment temperature sensor, and the environment humidity sensor, so as to adjust the environment temperature and humidity of the enclosed space.

10 Claims, 4 Drawing Sheets

HEAD MOUNTED DISPLAY

CROSS-REFERENCE TO RELATED APPLICATION

This application claims the priority benefit of Taiwan application serial no. 106100960, filed on Jan. 12, 2017. The entirety of the above-mentioned patent application is hereby incorporated by reference herein and made a part of this specification.

FIELD OF THE INVENTION

The invention relates to a head mounted display (HMD). More particularly, the invention relates to a HMD with an anti-fogging function.

DESCRIPTION OF RELATED ART

Nowadays, virtual reality (VR) technology has been gradually applied to consumer electronics, such as VR displays and VR glasses. Currently, most of the VR displays are HMDs which are handheld free and may be worn by users for a long time. Nevertheless, when a user wears the HMD for a long time in an air-conditioned room, since a temperature of a human body is higher than an environment temperature, temperature differences occur between the inside and the outside of the HMD. At the same time, if the user is sweating or producing tears or other secretions, the environment humidity of the inside of the HMD is thus raised to a relatively high level. Consequently, lenses of the HMD fog up easily, which leads to poor visual experiences for the user. In addition, the user may also experience dry eyes and thus feel uncomfortable after wearing the HMD for a long time if the environment humidity of the inside of the HMD is overly low.

Methods such as temperature control or applying anti-fogging coating are usually adopted by the existing HMDs for defogging the lenses. Miniature fans are required to be installed on the HMDs when defogging the lenses through applying the temperature control method. These miniature fans are conducive to dissipating heat for the HMDs and balancing the temperature of the inside of the HMDs. When the temperature is balanced, the lenses are prevented from fogging up. Nevertheless, when the miniature fans operate, problems such as vibrations and noises occur, thus affecting user experiences. By contrast, if the defogging action is performed by applying anti-fogging coating, the user has to apply anti-fogging coating on the lenses of the HMDs. Nevertheless, as the anti-fogging coating ages, the anti-fogging coating has to be re-applied repeatedly after a period of time.

SUMMARY OF THE INVENTION

The invention provides a head mounted display (HMD) for preventing lenses from fogging up and maintaining humidity in the inside of the HMD within a level at which human beings feel comfortable.

In an embodiment of the invention, a HMD provided is adapted to be worn on a head of a user. The HMD includes a lens unit, at least one lens temperature sensor, an environment temperature sensor, an environment humidity sensor, a temperature controller, a housing, and a display unit. The lens unit includes two lenses and a carrier. The lenses are disposed on the carrier. The carrier has a touching surface facing the user and a back surface opposite to the touching surface. An enclosed space is formed between the user and the touching surface of carrier. The at least one lens temperature sensor is disposed on the touching surface of the carrier and adjacent to the lenses to sense lens temperatures of the lenses. The environment temperature sensor is disposed on the touching surface of the carrier to sense an environment temperature of the enclosed space. The environment humidity sensor is disposed on the touching surface of the carrier to sense an environment humidity of the enclosed space. The temperature controller is disposed on the back surface of the carrier and increases or decreases a temperature of the enclosed space and the lens temperatures of the lenses according to sensing actions of the lens temperature sensor, the environment temperature sensor, and the environment humidity sensor, so as to adjust the environment temperature and the environment humidity of the enclosed space. The housing is assembled with the lens unit. The display unit is disposed between the housing and the lens unit.

In an embodiment of the invention, the at least one lens temperature sensor is two lens temperature sensors respectively disposed next to the lenses to respectively sense the lens temperatures of the lenses.

In an embodiment of the invention, the environment temperature sensor is an infrared temperature sensor.

In an embodiment of the invention, the temperature controller includes a thermoelectric cooling chip and a heat-conducting element. The heat-conducting element is disposed on the back surface of the carrier, and the thermoelectric cooling chip is disposed on the heat-conducting element.

In an embodiment of the invention, the temperature controller further includes a heat sink disposed on the thermoelectric cooling chip. The thermoelectric cooling chip is located between the heat sink and the heat-conducting element.

In an embodiment of the invention, the thermoelectric cooling chip has a first surface and a second surface opposite to each other. The first surface is in contact with the heat-conducting element, and the second surface is in contact with the heat sink. The thermoelectric cooling chip is adapted to receive a first input current to increase a temperature of the first surface and decrease a temperature of the second surface. The thermoelectric cooling chip is adapted to receive a second input current to decrease the temperature of the first surface and increase the temperature of the second surface.

In an embodiment of the invention, when the lens temperatures of the lenses sensed by the lens temperature sensor are close to a dew point temperature, and the environment humidity of the enclosed space sensed by the environment humidity sensor is greater than a predetermined value, the thermoelectric cooling chip is adapted to receive the first input current. When the environment humidity of the enclosed space sensed by the environment humidity sensor is less than the predetermined value, the thermoelectric cooling chip is adapted to receive the second input current.

In an embodiment of the invention, the heat sink is a heat dissipation fin.

In an embodiment of the invention, the heat-conducting element is a heat-conducting tube or a heat spreader.

In an embodiment of the invention, the display unit includes a display module and a motherboard. The display module is located between the lens unit and the motherboard.

In view of the foregoing, in the HMD provided by the embodiments of the invention, the temperature controller may increase or decrease the temperature of the enclosed space and the lens temperatures of the lenses according to the sensing actions of the lens temperature sensor, the environment temperature sensor, and the environment humidity sensor, so as to adjust the environment temperature and the environment humidity of the enclosed space. Thereby, the lenses are prevented from fogging up, and the user is thus able to obtain good visual experiences. Moreover, the humidity of the enclosed space is maintained within the level at which human beings feel comfortable.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
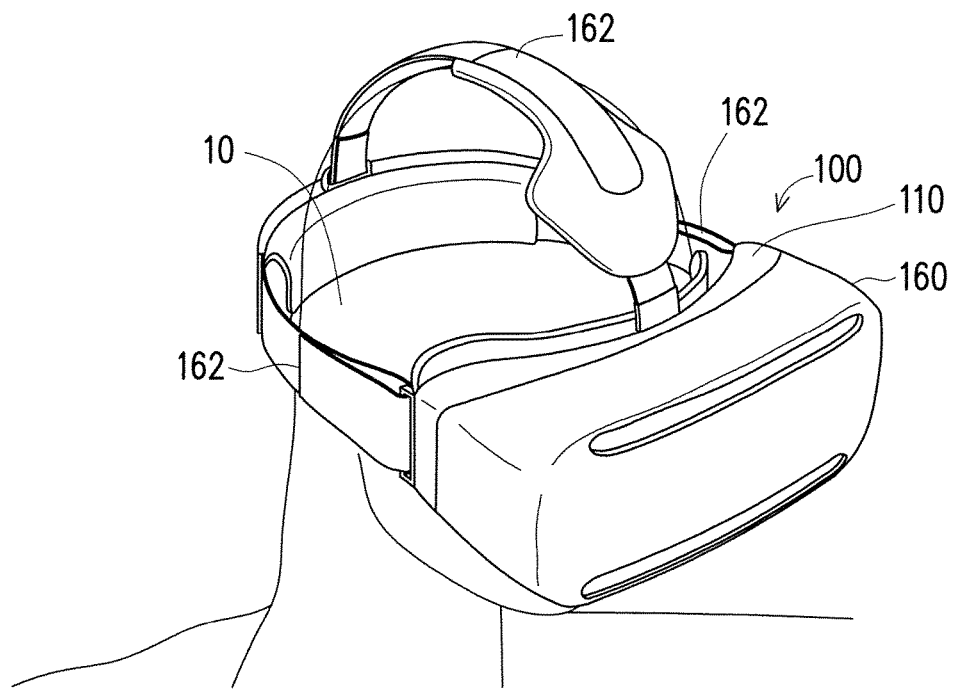
FIG. 1 is a schematic view illustrating a head mounted display (HMD) according to an embodiment of the invention.
Figure 2:
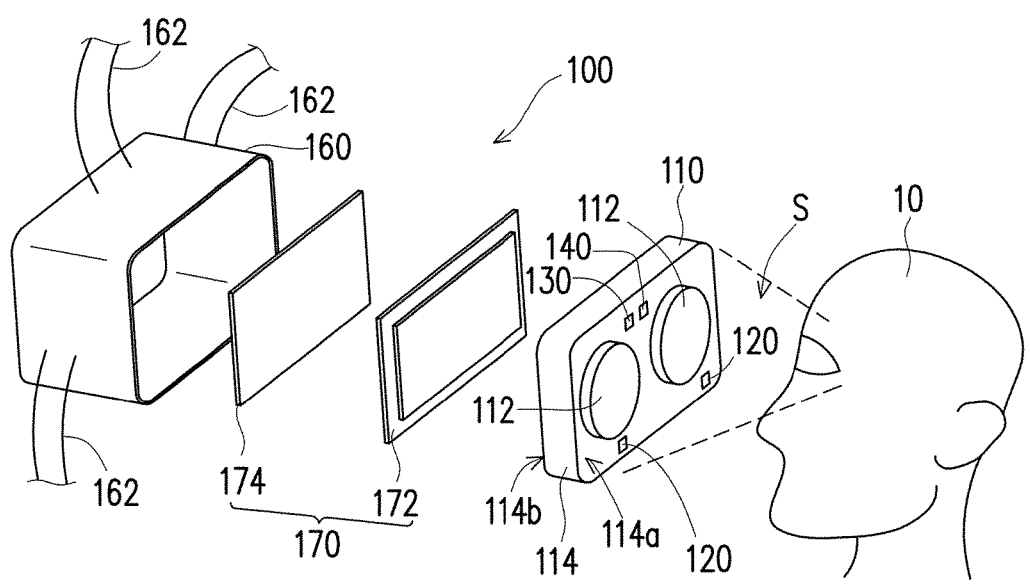
FIG. 2 is schematic exploded view illustrating the HMD in FIG. 1.
Figure 3:
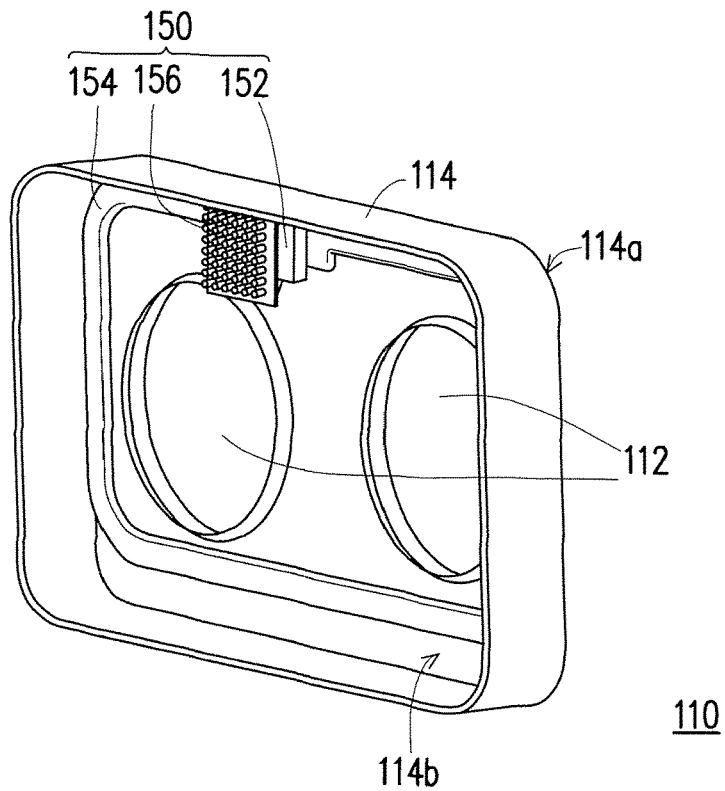
FIG. 3 is a schematic view illustrating a back surface of the lens unit in FIG. 2.
Figure 4:
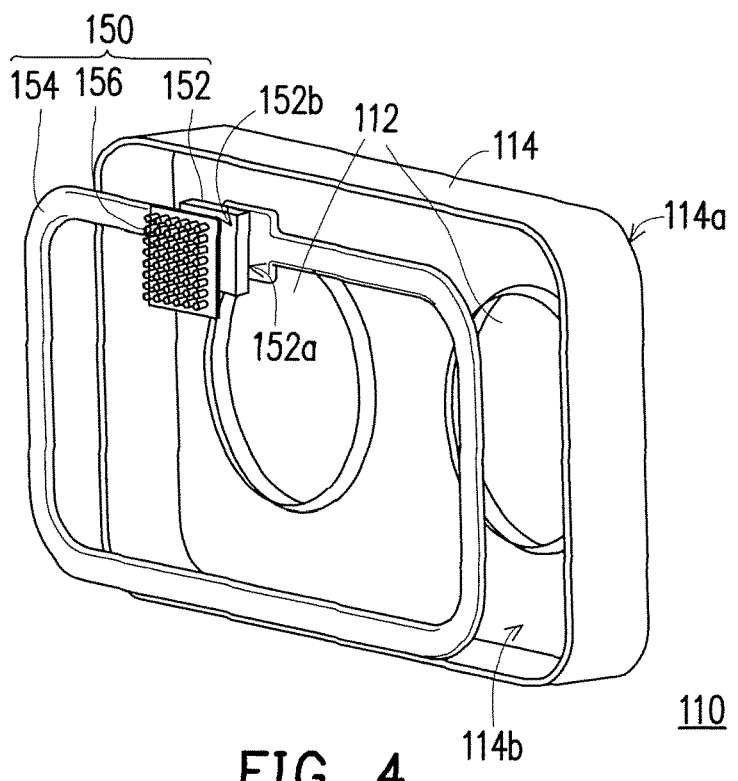
FIG. 4 is schematic exploded view illustrating the temperature controller in FIG. 3.

FIG. 1 is a schematic view illustrating a head mounted display (HMD) according to an embodiment of the invention. FIG. 2 is schematic exploded view illustrating the HMD in FIG. 1. FIG. 3 is a schematic view illustrating a back surface of the lens unit in FIG. 2. FIG. 4 is schematic exploded view illustrating the temperature controller in FIG. 3. Referring to FIG. 1, FIG. 2, and FIG. 3, a HMD 100 provided by the embodiment is adapted to be worn on a head of a user 10. The HMD 100 is, for example, a virtual reality (VR) display device, but the invention is not limited thereto.

As shown in FIG. 2 and FIG. 3, the HMD 100 provided by the embodiment includes a lens unit 110, at least one lens temperature sensor 120, an environment temperature sensor 130, an environment humidity sensor 140, a temperature controller 150, a housing 160, and a display unit 170. The lens unit 110 includes two lenses 112 and a carrier 114. The lenses 112 are disposed on the carrier 114. The carrier 114 has a touching surface 114a facing the user 10 and a back surface 114b opposite to the touching surface 114a. An enclosed space S is formed between the user 10 and the touching surface 114a of the carrier 114. The at least one lens temperature sensor 120 is disposed on the touching surface 114a of the carrier 114 and adjacent to the lenses 112 to sense lens temperatures of the lenses 112. The environment temperature sensor 130 is disposed on the touching surface 114a of the carrier 114 to sense an environment temperature of the enclosed space S. The environment humidity sensor 140 is disposed on the touching surface 114a of the carrier 114 to sense an environment humidity of the enclosed space S. The temperature controller 150 is disposed on the back surface 114b of the carrier 114. The temperature controller 150 increases or decreases the temperature of the enclosed space S and the lens temperatures of the lenses 112 according to sensing actions of the at least one lens temperature sensor 120, the environment temperature sensor 130, and the environment humidity sensor 140, so as to adjust the environment temperature and the environment humidity of the enclosed space S. The housing 160 is assembled with the lens unit 110. The display unit 170 is disposed between the housing 160 and the lens unit 110.

Specifically, the at least one lens temperature sensor 120 is substantially two lens temperature sensors 120 disposed on the touching surface 114a of the carrier 114. As shown in FIG. 2, the lens temperature sensors 120 are adjacent to the lenses 112 and located respectively next to the lenses 112, so as to respectively sense the lens temperatures of the lenses 112. The environment temperature sensor 130 is, for example, an infrared temperature sensor, but the invention is not limited thereto. The environment temperature sensor 130 and the environment humidity sensor 140 may be disposed on any location on the touching surface 114a of the carrier 114, and the location is not limited in the invention. As shown in FIG. 3, the temperature controller 150 is disposed on the back surface 114b of the carrier 114 and may increase or decrease the temperature of the enclosed space S and the lens temperatures of the lenses 112 according to the sensing actions of the lens temperature sensor 120, the environment temperature sensor 130, and the environment humidity sensor 140, so as to adjust the environment temperature and the environment humidity of the enclosed space S. Thereby, the lenses 112 are prevented from fogging up, the user 10 is thus able to obtain good visual experiences, and a humidity of the enclosed space S is maintained within a level at which human beings feel comfortable.

Furthermore, referring to FIG. 3 and FIG. 4, in the embodiment, the temperature controller 150 includes a thermoelectric cooling chip 152 and a heat-conducting element 154. The heat-conducting element 154 is disposed on the back surface 114b of the carrier 114, and the thermoelectric cooling chip 152 is disposed on the heat-conducting element 154. Here, the heat-conducting element 154 is, for example, a heat-conducting tube or a heat spreader with a high thermal conductivity coefficient and is configured to heat the enclosed space S evenly. As shown in FIG. 4, the heat-conducting element 154 may surround the back surface 114b of the carrier 114, but the invention is not limited thereto. Besides, the temperature controller 150 provided by the embodiment further includes a heat sink 156 disposed on the thermoelectric cooling chip 152. The thermoelectric cooling chip 152 is located between the heat sink 156 and the heat-conducting element 154. Here, the heat sink 156 is, for example, a heat dissipation fin, but the invention is not limited thereto. The heat sink 156 may enhance heat dissipation efficiency of the thermoelectric cooling chip 152.

Referring to FIG. 3 and FIG. 4, the thermoelectric cooling chip 152 provided by the embodiment has a first surface 152a and a second surface 152b opposite to each other. The first surface 152a is in contact with the heat-conducting element 154, and the second surface 152b is in contact with the heat sink 156. The thermoelectric cooling chip 152 is adapted to receive a first input current to increase a temperature of the first surface 152a and decrease a temperature of the second surface 152b. The thermoelectric cooling chip 152 is also adapted to receive a second input current to decrease the temperature of the first surface 152a and increase the temperature of the second surface 152b.

When the lens temperatures of the lenses 112 sensed by the lens temperature sensor 120 are close to a dew point temperature, and the environment humidity of the enclosed space S sensed by the environment humidity sensor 130 is greater than a predetermined value, the thermoelectric cooling chip 152 is adapted to receive the first input current, so as to increase the temperature of the first surface 152a, decrease the temperature of the second surface 152b, and thereby heat the enclosed space S and the lenses 112 evenly. The first surface 152a of the thermoelectric cooling chip 152 is in contact with the heat-conducting element 154, such that the first surface 152a transmits thermal energy to the heat-conducting element 154. Thereby, a temperature of the heat-conducting element 154 increases, and the enclosed space S and the lenses 112 are evenly heated. When the temperature of the enclosed space S and the lens temperatures of the lenses 112 increase, the environment humidity of the enclosed space S decreases, and the lens temperatures of the lenses 112 are close to the temperature of the enclosed space S. Consequently, the lenses 112 are prevented from fogging up, and the user 10 is thus able to obtain good visual experiences.

When the environment humidity of the enclosed space S sensed by the environment humidity sensor 130 is less than the predetermined value, the thermoelectric cooling chip 152 is adapted to receive the second input current. When the thermoelectric cooling chip 152 receives the second input current, the temperature of the first surface 152a of the thermoelectric cooling chip 152 decreases, and the temperature of the second surfaced 152b increases. Consequently, the temperature of the enclosed space S decreases, and the environment humidity of the enclosed space S increases. Thereby, the environment humidity of the enclosed space S is maintained within the level at which human beings feel comfortable, and the user 10 experiences no dry eyes after wearing the HMD 100 for a long time. The first surface 152a of the thermoelectric cooling chip 152 is in contact with the heat-conducting element 154, such that the first surface 152a absorbs thermal energy of the heat-conducting element 154. Thereby, the temperature of the heat-conducting element 154 decreases, and the temperature of the enclosed space S and the lens temperatures of the lenses 112 further drop. When the temperature of the first surface 152a decreases, the temperature of the second surface 152b increases. At this time, thermal energy of the second surface 152b is dissipated by the heat sink 156 in contact with the second surface 152b, such that the temperature controller 150 is not damaged owing to overheating.

The thermoelectric cooling chip 152 increases or decreases the temperatures of the first surface 152a and the second surface 152b through receiving the first input current or the second input current. Levels of the temperature increase or decrease of the first surface 152a and the second surface 152b may be adjusted through controlling magnitudes of the first input current and the second input current. Consequently, the increases or decreases in the temperature of the enclosed space S and the lens temperature of the lenses 112 may be controlled. Hence, the magnitude of the first input current or the magnitude of the second input current may be controlled as required by the user 10, so as to adjust the levels of the temperature increase or decrease of the first surface 152a and the second surface 152b. As such, the temperature of the enclosed space S, the lens temperatures of the lenses 112, and the environment humidity of the enclosed space S are maintained within a level at which the user 10 feels comfortable.

In addition, as shown in FIG. 1 and FIG. 2, the housing 160 has a plurality of retaining belts 162 configured to fix the HMD 100 onto the head of the user 10, and the HMD 100 is securely located at the locations of the eyes of the user 10. Thereby, the eyes of the user 10 are able to see VR images through the HMD 100 and obtain VR visual experiences. The display unit 170 has a display module 172 and a motherboard 174. The display module 172 is, for example, configured to display images, and the motherboard 174 is able to drive the display module 172. The first input current and the second input current may be inputted to the thermoelectric cooling chip 152 of the temperature controller 150.

Figure 5:
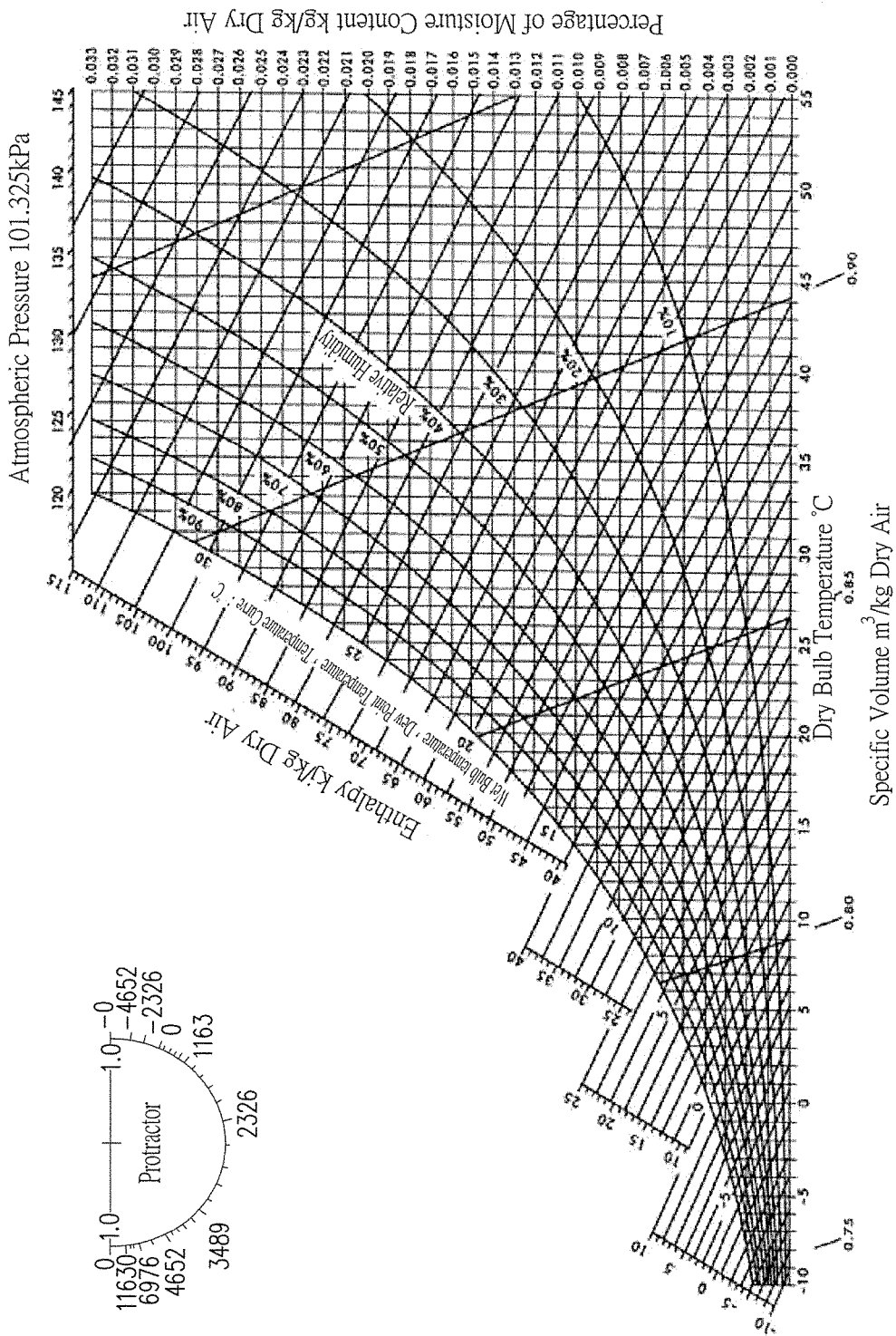
FIG. 5 is a curve diagram of air humidity.

FIG. 5 is a curve diagram of air humidity. Referring to FIG. 5, a diagram of an air humidity curve is set inside the temperature controller 150 for controlling purposes. For instance, the predetermined value of the environment humidity is 50%, i.e., an environment humidity at which the user 10 feels comfortable. When the environment temperature of the enclosed space S is 25° C., and the environment humidity reaches 70%, the dew point temperature as shown in FIG. 5 arrives at 19° C. Meanwhile, when the lens temperatures of the lenses 112 sensed by the lens temperature sensor 120 are 20° C., i.e., close to the dew point temperature at 19° C., and the environment humidity of the enclosed space S sensed by the environment humidity sensor 130 is 70%, i.e., greater than the predetermined value of 50%, the thermoelectric cooling chip 152 receives the first input current and thereby evenly heats the enclosed space S and the lenses 112. Referring to FIG. 5, it can be seen that when the temperature increases, the environment humidity decreases. In other words, when the temperature of the enclosed space S and the lens temperatures of the lenses 112 increase, the environment humidity of the enclosed space S decreases, and consequently, the lenses 112 are prevented from fogging up.

When the environment humidity of the enclosed space S sensed by the environment humidity sensor 130 is 30%, i.e., less than the predetermined value of 50%, the thermoelectric cooling chip 152 receives the second input current, and thereby the temperature of the enclosed space S decreases. Referring to FIG. 5, it can be seen that when the temperature decreases, the environment humidity increases. In other words, when the temperature of the enclosed space S decreases, the environment humidity of the enclosed space S increases, and the environment humidity of the enclosed space S is maintained within the level at which human beings feel comfortable. Certainly, the above illustration is merely exemplary, and the invention is not limited thereto.

To sum up, in the HMD provided by the embodiments of the invention, the temperature controller may increase or decrease the temperature of the enclosed space and the lens temperatures of the lenses according to the sensing actions of the lens temperature sensor, the environment temperature sensor, and the environment humidity sensor, so as to adjust the environment temperature and the environment humidity of the enclosed space. Thereby, the lenses are prevented from fogging up, and the user is thus able to obtain good visual experiences. Moreover, the humidity of the enclosed space is maintained within the level at which human beings feel comfortable, such that the user experiences no dry eyes after wearing the HMD for a long time. Furthermore, the temperature controller of the HMD has the thermoelectric cooling chip and the heat-conducting element. The increases or decreases in the temperature of the enclosed space and the lens temperature of the lenses may be controlled through controlling the magnitudes of the first input current and the second input current received by the thermoelectric cooling chip. The enclosed space may be evenly heated through the heat-conducting element with a high heat conductivity coefficient. In addition, a miniature fan for defogging purposes is not required to be installed in the HMD provided by the embodiments of the invention, and thereby problems such as vibrations, noises, and aging of anti-fogging coating are avoided because no anti-fogging coating is required to be applied periodically.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A head mounted display (HMD) adapted to be worn on a head of a user, the HMD comprising:
    a lens unit, comprising two lenses and a carrier, the lenses being disposed on the carrier, the carrier having a touching surface facing the user and a back surface opposite to the touching surface, an enclosed space being formed between the user and the touching surface of the carrier;
    at least one lens temperature sensor, disposed on the touching surface of the carrier and adjacent to the lenses to sense lens temperatures of the lenses;
    an environment temperature sensor, disposed on the touching surface of the carrier to sense an environment temperature of the enclosed space;
    an environment humidity sensor, disposed on the touching surface of the carrier to sense an environment humidity of the enclosed space;
    a temperature controller, disposed on the back surface of the carrier, wherein the temperature controller increases or decreases a temperature of the enclosed space and the lens temperatures of the lenses according to sensing actions of the at least one lens temperature sensor, the environment temperature sensor, and the environment humidity sensor to adjust the environment temperature and the environment humidity of the enclosed space;
    a housing, assembled with the lens unit; and
    a display unit, disposed between the housing and the lens unit.

2. The HMD as claimed in claim 1, wherein the at least one lens temperature sensor is two lens temperature sensors respectively disposed next to the lenses to respectively sense the lens temperatures of the lenses.

3. The HMD as claimed in claim 1, wherein the environment temperature sensor is an infrared temperature sensor.

4. The HMD as claimed in claim 1, wherein the temperature controller comprises a thermoelectric cooling chip and a heat-conducting element, the heat-conducting element is disposed on the back surface of the carrier, and the thermoelectric cooling chip is disposed on the heat-conducting element.

5. The HMD as claimed in claim 4, wherein the temperature controller further comprises a heat sink disposed on the thermoelectric cooling chip, and the thermoelectric cooling chip is located between the heat sink and the heat-conducting element.

6. The HMD as claimed in claim 5, wherein the thermoelectric cooling chip has a first surface and a second surface opposite to each other, the first surface is in contact with the heat-conducting element, the second surface is in contact with the heat sink, the thermoelectric cooling chip is adapted to receive a first input current to increase a temperature of the first surface and decrease a temperature of the second surface, and the thermoelectric cooling chip is adapted to receive a second input current to decrease the temperature of the first surface and increase the temperature of the second surface.

7. The HMD as claimed in claim 6, wherein when the lens temperatures of the lenses sensed by the at least one lens temperature sensor are close to a dew point temperature, and the environment humidity of the enclosed space sensed by the environment humidity sensor is greater than a predetermined value, the thermoelectric cooling chip is adapted to receive the first input current, and when the environment humidity of the enclosed space sensed by the environment humidity sensor is less than the predetermined value, the thermoelectric cooling chip is adapted to receive the second input current.

8. The HMD as claimed in claim 5, wherein the heat sink is a heat dissipation fin.

9. The HMD as claimed in claim 4, wherein the heat-conducting element comprises a heat-conducting tube or a heat spreader.

10. The HMD as claimed in claim 1, wherein the display unit comprises a display module and a motherboard, and the display module is located between the lens unit and the motherboard.

* * * * *